United States Patent
Kurita

(10) Patent No.: US 12,136,909 B2
(45) Date of Patent: Nov. 5, 2024

(54) VIBRATOR ELEMENT INCLUDING BASE PART, VIBRATING ARM AND WEIGHT PROVIDED TO VIBRATING ARM, VIBRATOR DEVICE INCLUDING VIBRATOR ELEMENT, AND METHOD OF MANUFACTURING VIBRATOR ELEMENT

(71) Applicant: SEIKO EPSON CORPORATION, Tokyo (JP)

(72) Inventor: Hideaki Kurita, Tokyo-to (JP)

(73) Assignee: SEIKO EPSON CORPORATION, Tokyo (JP)

( * ) Notice: Subject to any disclaimer, the term of this patent is extended or adjusted under 35 U.S.C. 154(b) by 859 days.

(21) Appl. No.: 17/178,733

(22) Filed: Feb. 18, 2021

(65) Prior Publication Data

US 2021/0265973 A1 Aug. 26, 2021

(30) Foreign Application Priority Data

Feb. 20, 2020 (JP) .................................. 2020-027012

(51) Int. Cl.
| | |
|---|---|
| *H03H 9/19* | (2006.01) |
| *H03H 3/02* | (2006.01) |
| *H03H 9/05* | (2006.01) |
| *H03H 9/10* | (2006.01) |

(52) U.S. Cl.
CPC .............. *H03H 9/19* (2013.01); *H03H 3/02* (2013.01); *H03H 9/0557* (2013.01); *H03H 9/1021* (2013.01); *H03H 2003/022* (2013.01)

(58) Field of Classification Search
CPC ...... H03H 9/19; H03H 9/0557; H03H 9/1021; H03H 2003/022

USPC ......................................................... 310/367
See application file for complete search history.

(56) References Cited

U.S. PATENT DOCUMENTS

| | | | |
|---|---|---|---|
| 7,948,157 B2 | 5/2011 | Iwatate et al. | |
| 8,760,041 B2 | 6/2014 | Kawai | |
| 2006/0070442 A1 | 4/2006 | Kawauchi et al. | |
| 2008/0193726 A1* | 8/2008 | Shimada ............... | B23K 26/351 |
| | | | 219/121.72 |
| 2009/0160295 A1 | 6/2009 | Iwatate et al. | |

(Continued)

FOREIGN PATENT DOCUMENTS

| | | |
|---|---|---|
| JP | 2006-105614 | 4/2006 |
| JP | 2007-163143 | 6/2007 |

(Continued)

*Primary Examiner* — Emily P Pham
*Assistant Examiner* — Monica Mata
(74) *Attorney, Agent, or Firm* — Rankin, Hill & Clark LLP

(57) ABSTRACT

A vibrator element includes at least one vibrating arm with a weight provided thereto. The weight is provided with at least one processing scar. When an axis which overlaps a center in a width direction of the vibrating arm, and which extends along an extending direction of the vibrating arm is a central axis, and an axis which overlaps a centroid of the vibrating arm, and which extends along the extending direction of the vibrating arm is a centroid axis, the processing scar is formed in at least an area at the centroid axis side with respect to the central axis. S1>S2, where an area of the processing scar located at the centroid axis side with respect to the central axis is S1, and an area of the processing scar located at an opposite side to the centroid axis with respect to the central axis is S2.

11 Claims, 12 Drawing Sheets

(56) References Cited

U.S. PATENT DOCUMENTS

| | | | |
|---|---|---|---|
| 2011/0291524 A1 | 12/2011 | Kawase et al. | |
| 2012/0206211 A1 | 8/2012 | Kobayashi | |
| 2015/0135931 A1 | 5/2015 | Yamada et al. | |
| 2019/0006575 A1 | 1/2019 | Yamaguchi et al. | |
| 2019/0212145 A1* | 7/2019 | Kiya | H03H 9/02133 |
| 2019/0301867 A1 | 10/2019 | Sasaki et al. | |
| 2021/0237202 A1 | 8/2021 | Kawauchi et al. | |
| 2021/0265973 A1 | 8/2021 | Kurita | |
| 2021/0313959 A1 | 10/2021 | Ogura et al. | |

FOREIGN PATENT DOCUMENTS

| | | |
|---|---|---|
| JP | 2009-171553 | 7/2009 |
| JP | 2018-165644 | 10/2018 |
| JP | 2019-012963 | 1/2019 |

* cited by examiner

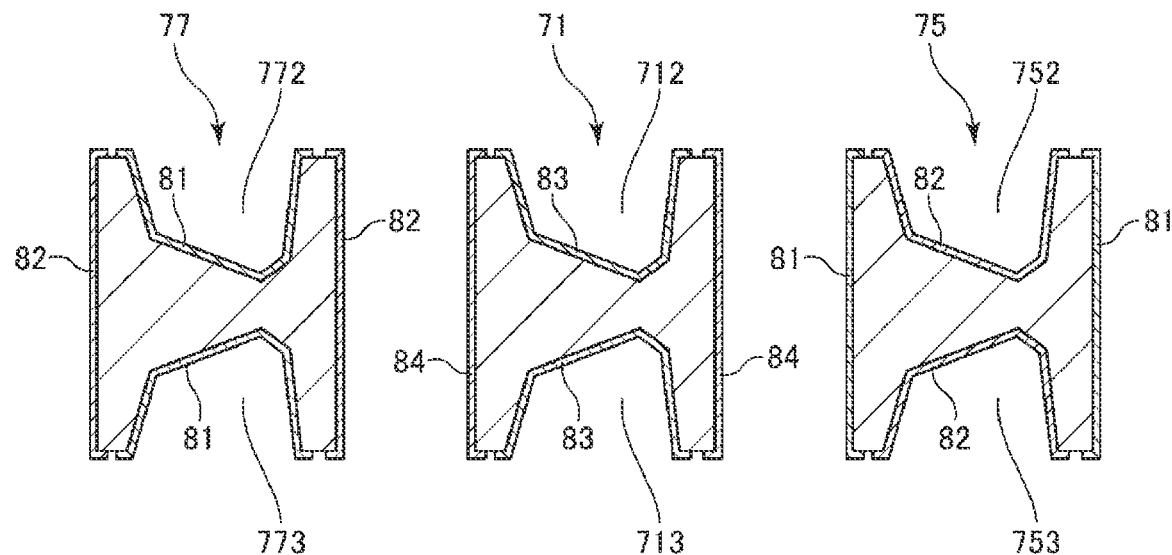
FIG. 4
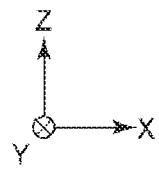
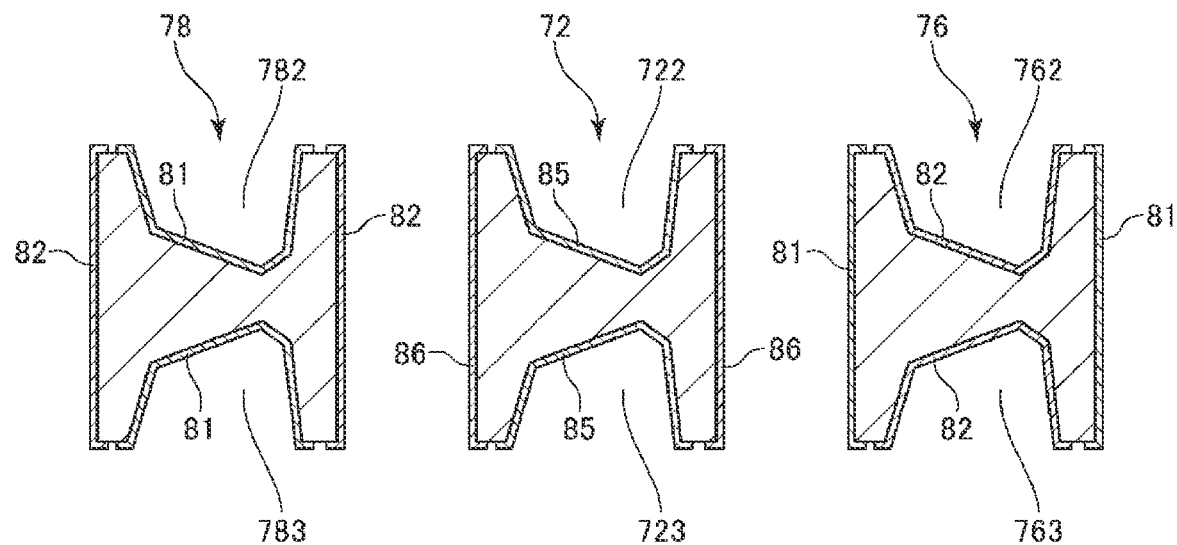
FIG. 5
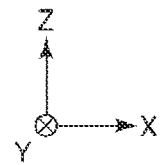

FIG. 8
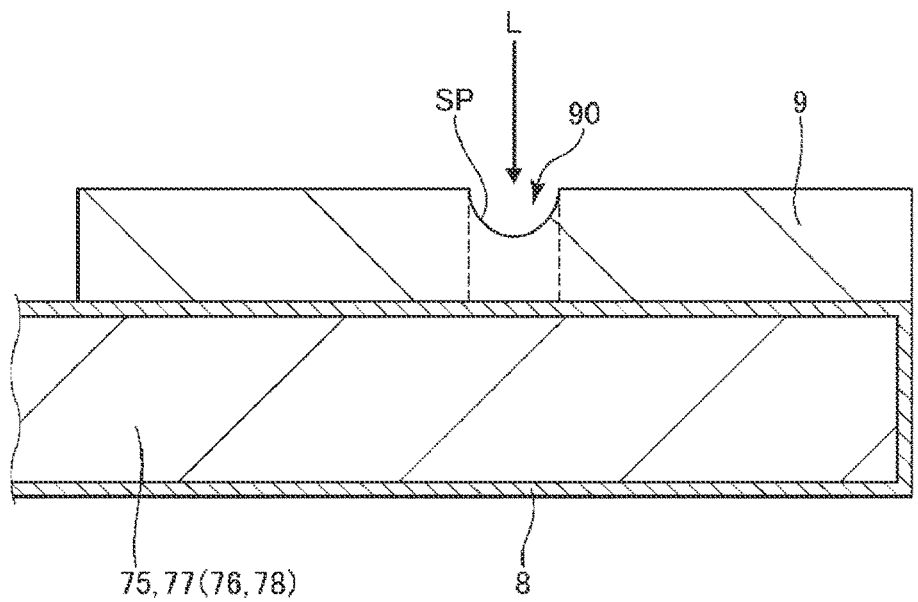
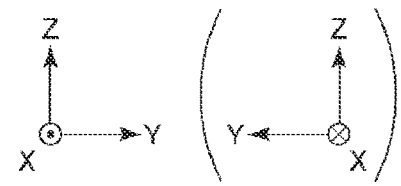
FIG. 9
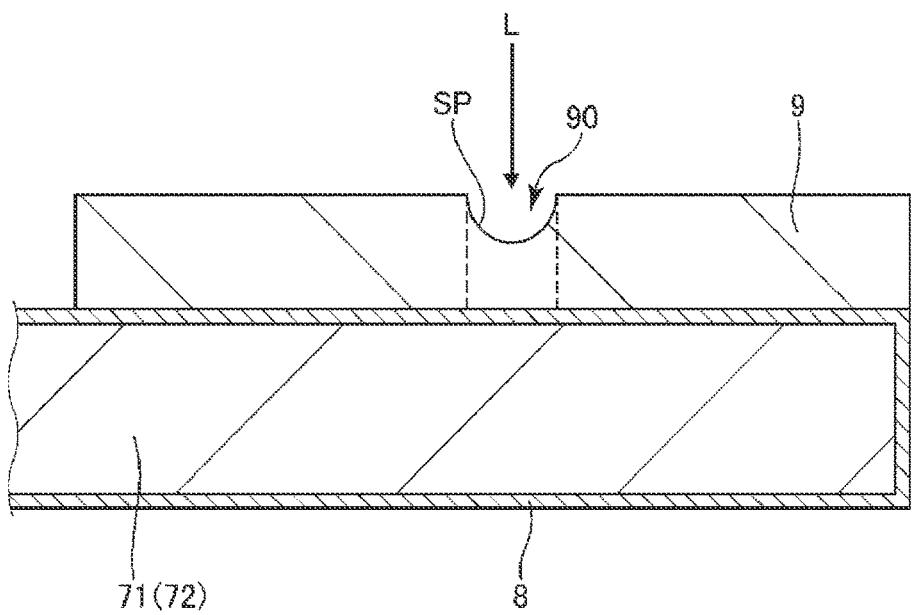
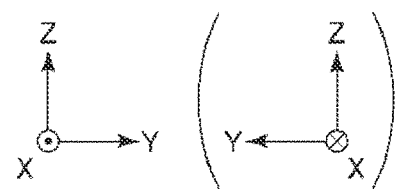

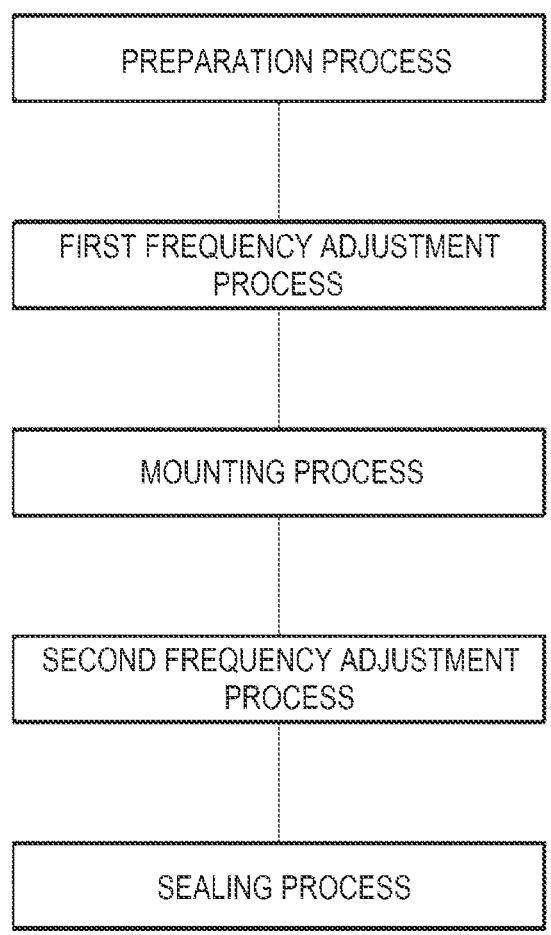

VIBRATOR ELEMENT INCLUDING BASE PART, VIBRATING ARM AND WEIGHT PROVIDED TO VIBRATING ARM, VIBRATOR DEVICE INCLUDING VIBRATOR ELEMENT, AND METHOD OF MANUFACTURING VIBRATOR ELEMENT

The present application is based on, and claims priority from JP Application Serial Number 2020-027012, filed Feb. 20, 2020, the disclosure of which is hereby incorporated by reference herein in its entirety.

BACKGROUND

1. Technical Field

The present disclosure relates to a vibrator element, a vibrator device, and a method of manufacturing a vibrator element.

2. Related Art

For example, in JP-A-2009-171553 (Document 1), there is described a method of providing a tip part of a vibrating arm with a metal film, and then irradiating the metal film with a laser beam to thereby remove a part of the metal film as a method of adjusting the frequency of a tuning-fork vibrator element.

The tuning-fork vibrator element described in Document 1 is provided with grooves disposed on an upper surface and a lower surface of the vibrating arm, and electrodes formed in the grooves in order to further enhance the piezoelectric effect. However, since the grooves are formed using wet etching, the shape of the groove becomes asymmetric about the central axis of the vibrating arm due to the etching anisotropy caused by the crystal axes of quartz crystal. When the shape of the groove becomes asymmetric about the central axis of the vibrating arm, the centroid of the vibrating arm is shifted from the central axis, and an unwanted vibration (spurious vibration) is excited due to the shift.

In such a tuning-fork vibrator element, when, for example, a weight is irradiated with the laser beam so as to be symmetric about the central axis, there arises a problem that the shift of the centroid from the central axis increases, and thus, the unwanted vibration increases.

SUMMARY

A vibrator element according to an application example includes a base part, at least one vibrating arm coupled to the base part, and a weight provided to a principal surface of the vibrating arm, wherein the weight is provided with at least one processing scar which is partially removed, and which is recessed in a thickness direction of the vibrating arm, when an axis which overlaps a center in a width direction of the vibrating arm, and which extends along an extending direction of the vibrating arm is defined as a central axis, and an axis which overlaps a centroid of the vibrating arm, and which extends along the extending direction of the vibrating arm is defined as a centroid axis in a plan view of the principal surface, the processing scar is formed in at least an area at the centroid axis side with respect to the central axis, and S1>s2, an area of the processing scar located at the centroid axis side with respect to the central axis is S1, and an area of the processing scar located at an opposite side to the centroid axis with respect to the central axis is S2.

A vibrator device according to an application example includes the vibrator element described above.

A method of manufacturing a vibrator element according to an application example includes the steps of preparing a vibrator element including a base part, a vibrating arm coupled to the base part, and a weight provided to a principal surface of the vibrating arm, and forming at least one processing scar on the weight by irradiating the weight with a laser beam to thin or remove the weight in a thickness direction of the vibrating arm, wherein when an axis which overlaps a center in a width direction of the vibrating arm, and which extends along an extending direction of the vibrating arm is defined as a central axis, and an axis which overlaps a centroid of the vibrating arm, and which extends along the extending direction of the vibrating arm is defined as a centroid axis in a plan view of the principal surface, the processing scar is formed in at least an area at the centroid axis side with respect to the central axis in the forming at least one processing scar, and S1>S2, an area of the processing scar located at the centroid axis side with respect to the central axis is S1, and an area of the processing scar located at an opposite side to the centroid axis with respect to the central axis is S2.

BRIEF DESCRIPTION OF THE DRAWINGS

FIG. 4 is a cross-sectional view along the line A-A in FIG. 3.

FIG. 5 is a cross-sectional view along the line B-B in FIG. 3.

FIG. 8 is a cross-sectional view of a drive arm provided to the vibrator element shown in FIG. 3.

FIG. 9 is a cross-sectional view of a detection arm provided to the vibrator element shown in FIG. 3.

FIG. 15 is a diagram showing a manufacturing process of the vibrator device shown in FIG. 1.

DESCRIPTION OF AN EXEMPLARY EMBODIMENT

A vibrator element, a vibrator device, and a method of manufacturing a vibrator element according to the present disclosure will hereinafter be described in detail based on an embodiment shown in the accompanying drawings.

First Embodiment

Figure 1:
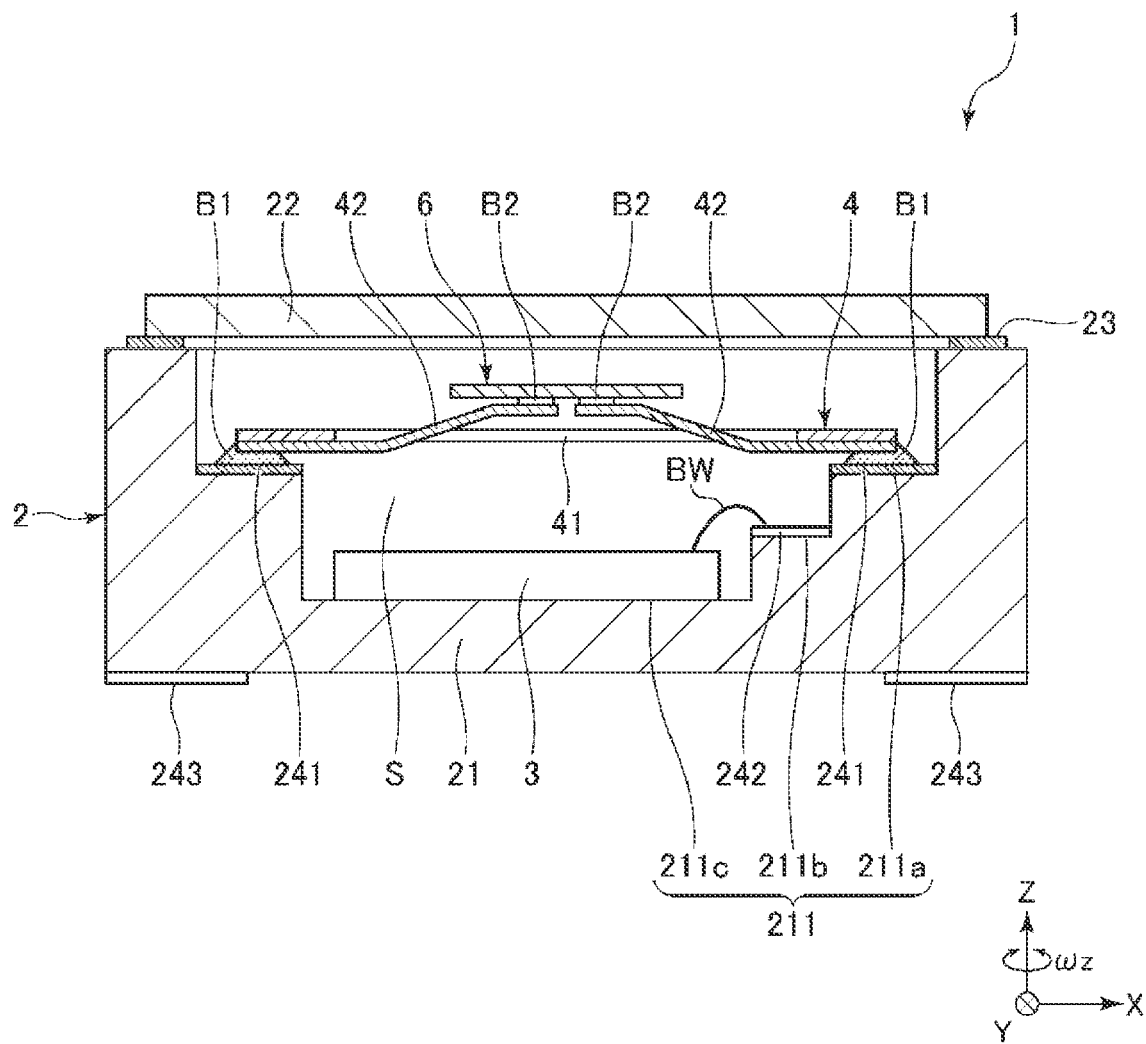
FIG. 1 is a cross-sectional view showing a vibrator device according to a first embodiment of the present disclosure.

FIG. 1 is a cross-sectional view showing a vibrator device according to a first embodiment of the present disclosure.

Figure 2:
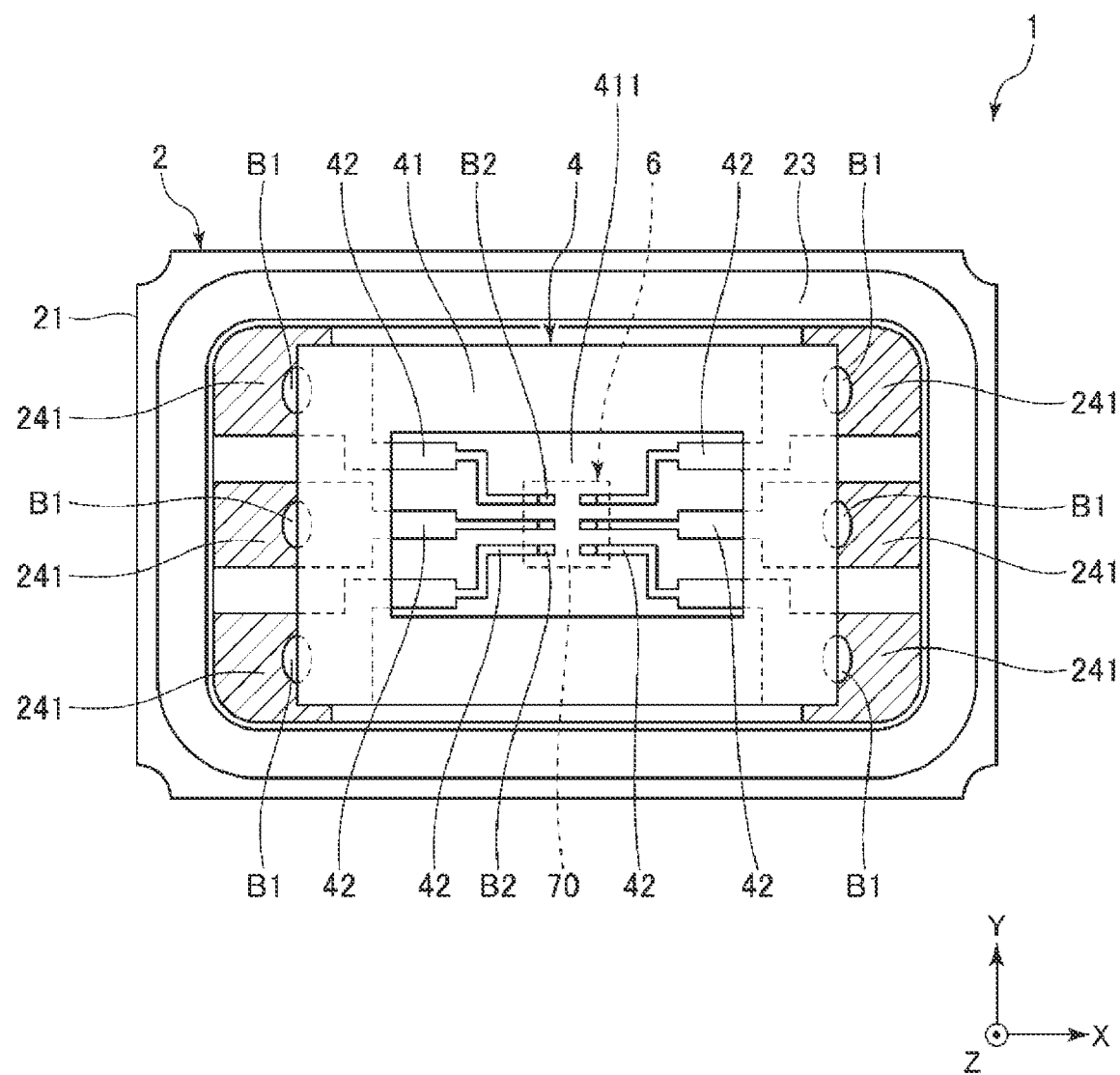
FIG. 2 is a plan view of the vibrator device shown in FIG. 1.
Figure 3:
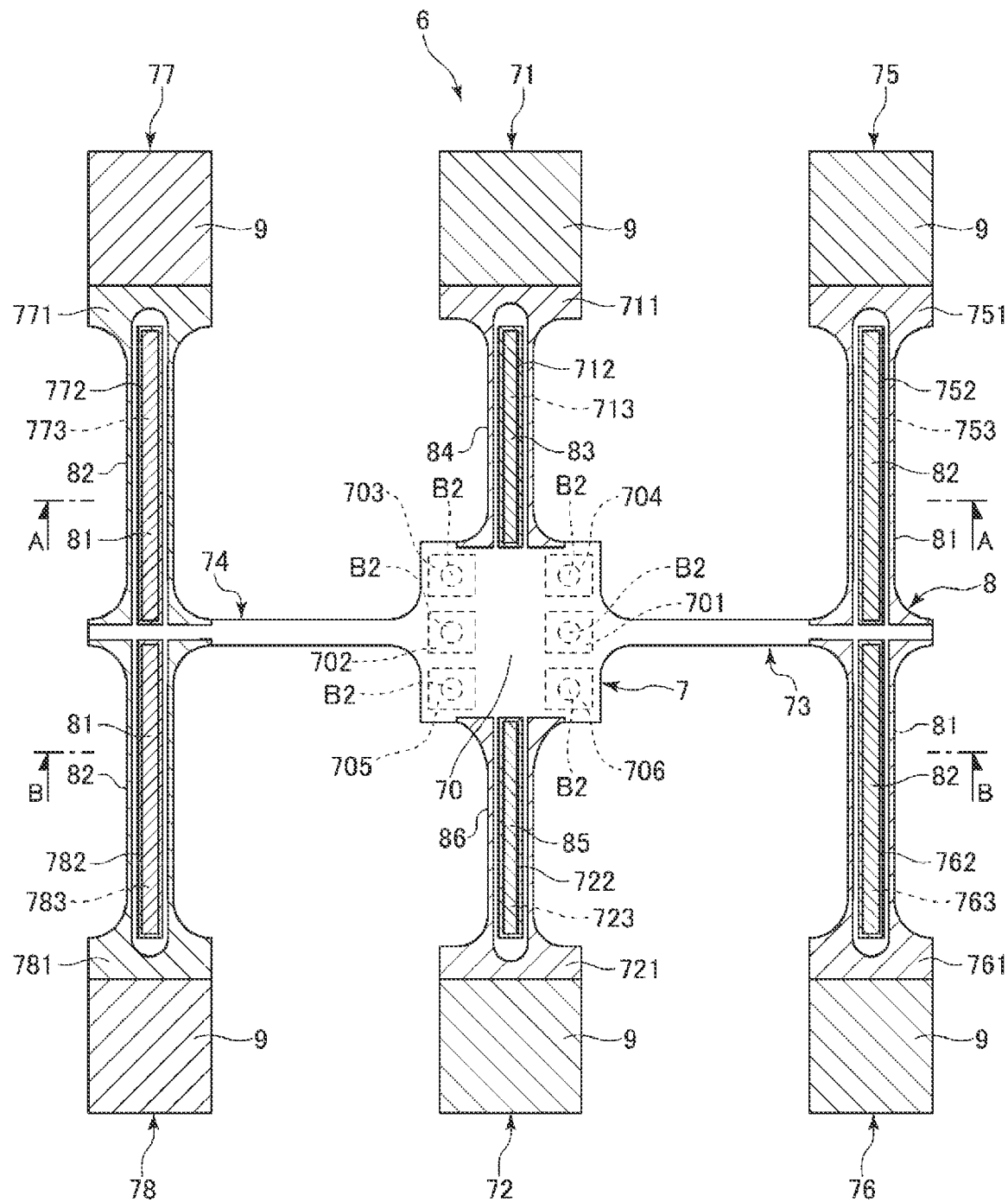
FIG. 3 is a plan view of a vibrator element provided to the vibrator device shown in FIG. 1.
Figure 6:
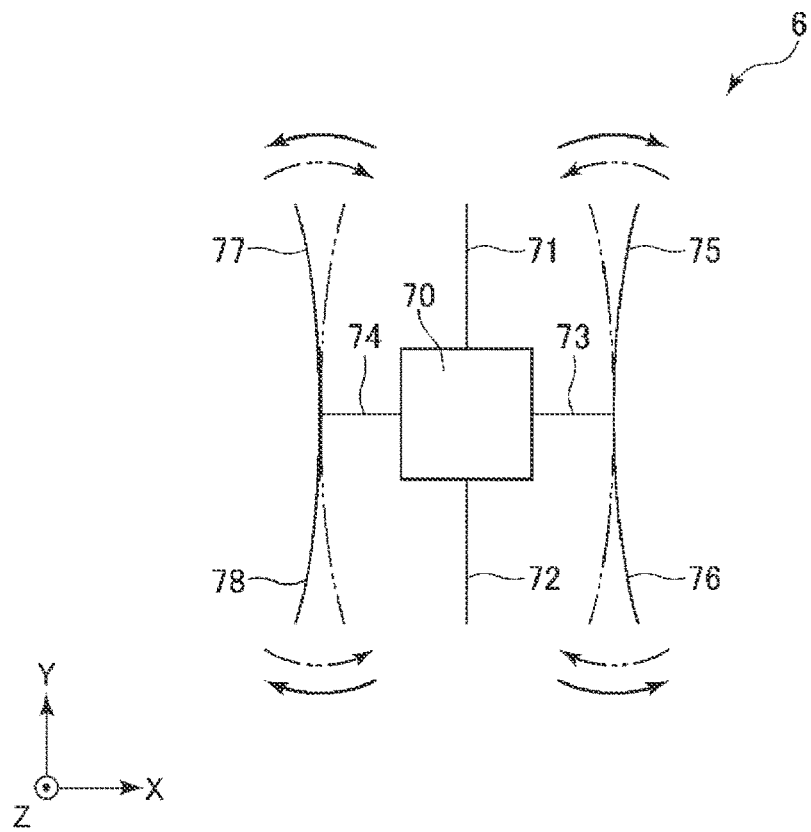
FIG. 6 is a schematic diagram for explaining an action of the vibrator element shown in FIG. 3.
Figure 7:
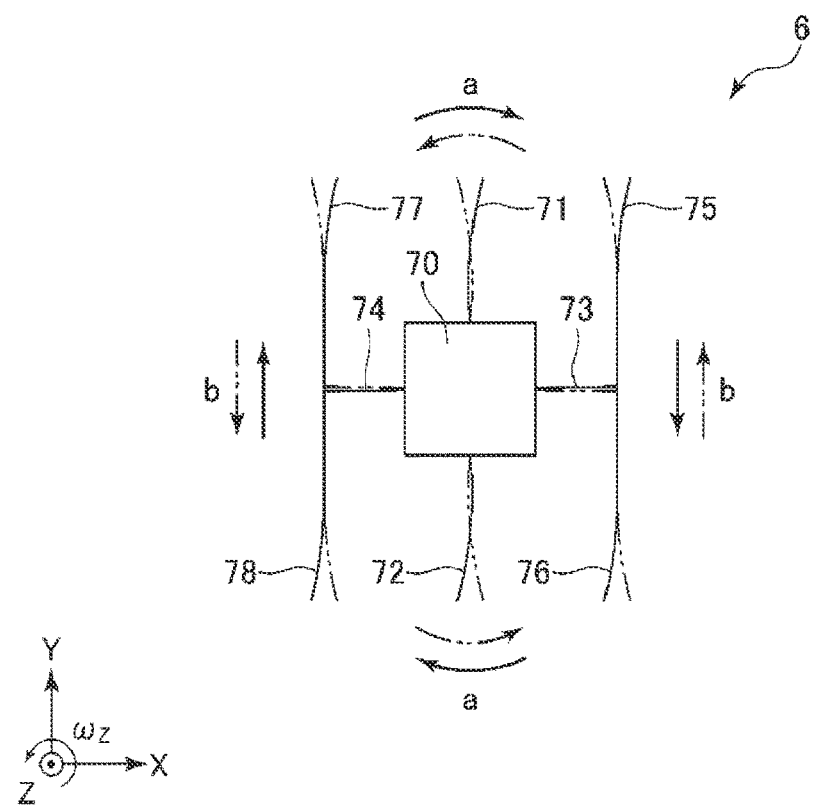
FIG. 7 is a schematic diagram for explaining an action of the vibrator element shown in FIG. 3.
Figure 10:
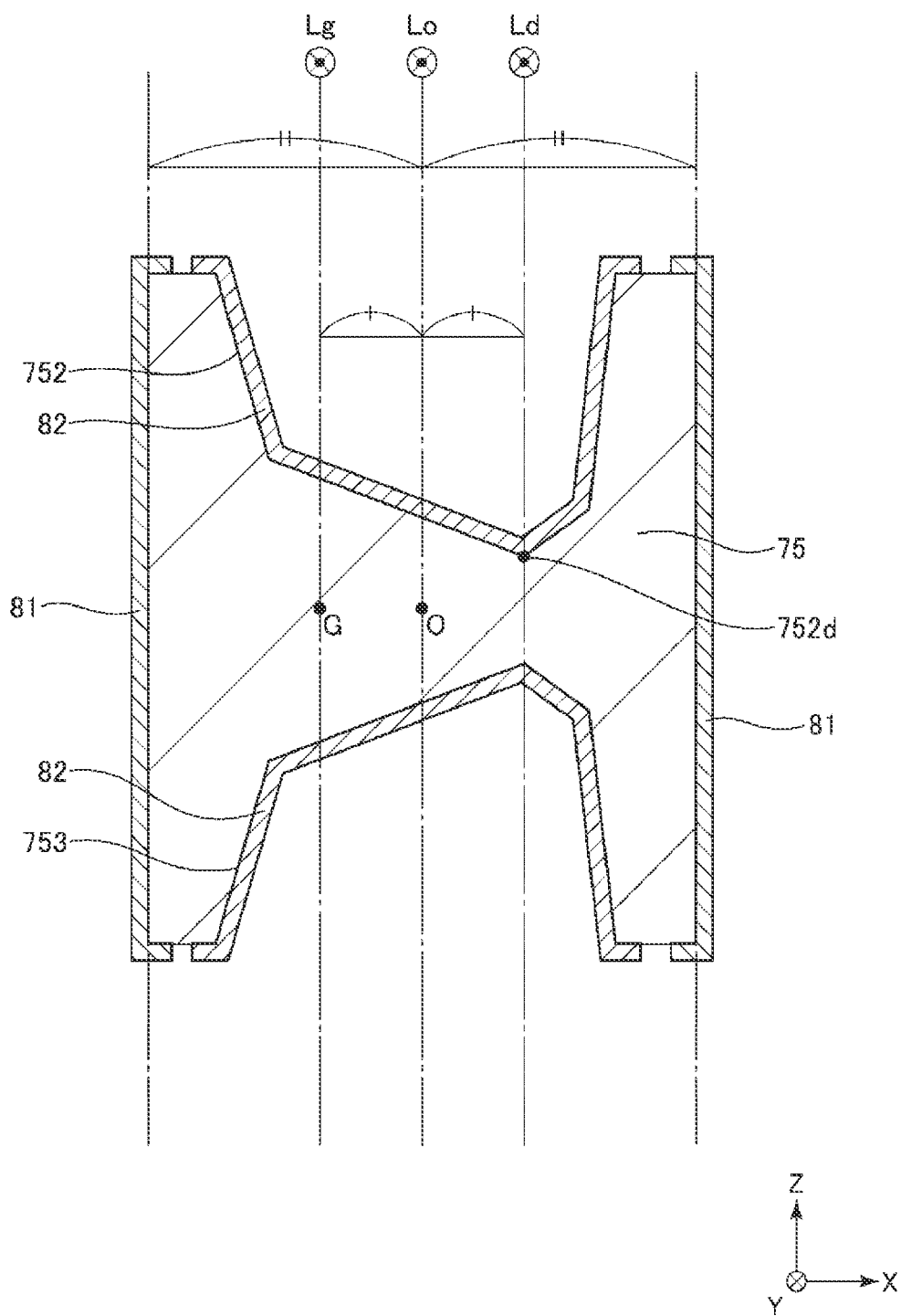
FIG. 10 is a cross-sectional view showing a shape of a groove in the drive arm.
Figure 11:
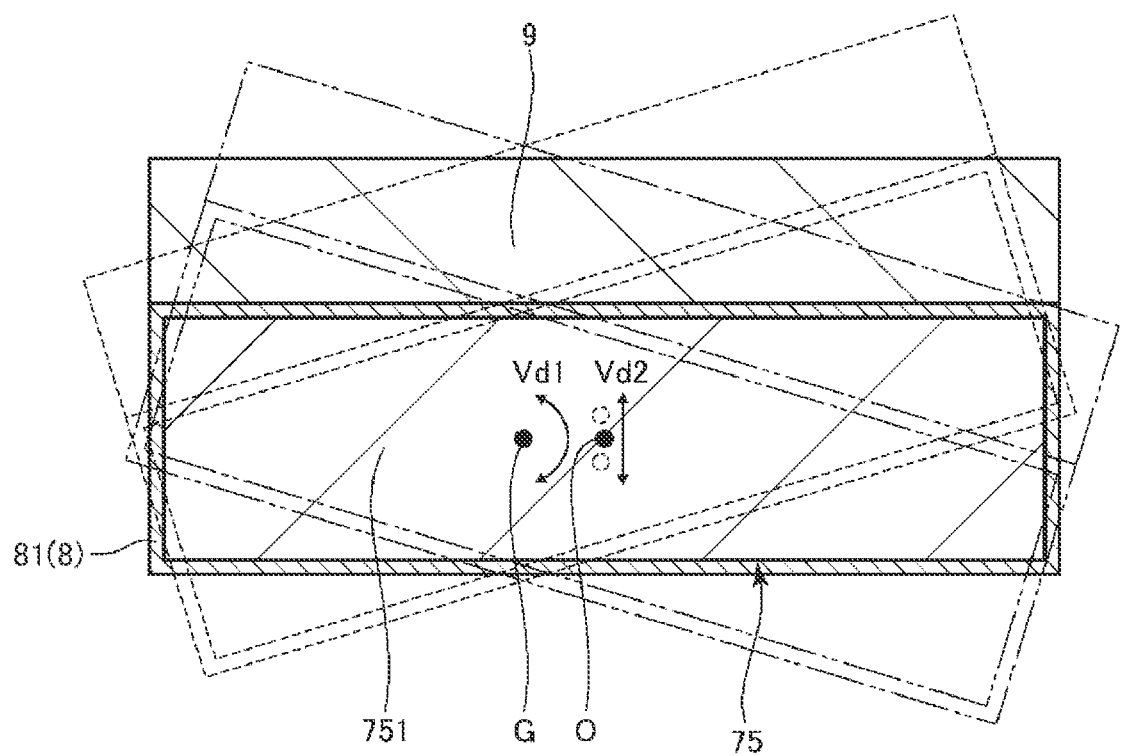
FIG. 11 is a cross-sectional view showing an unwanted vibration of the drive arm.
Figure 12:
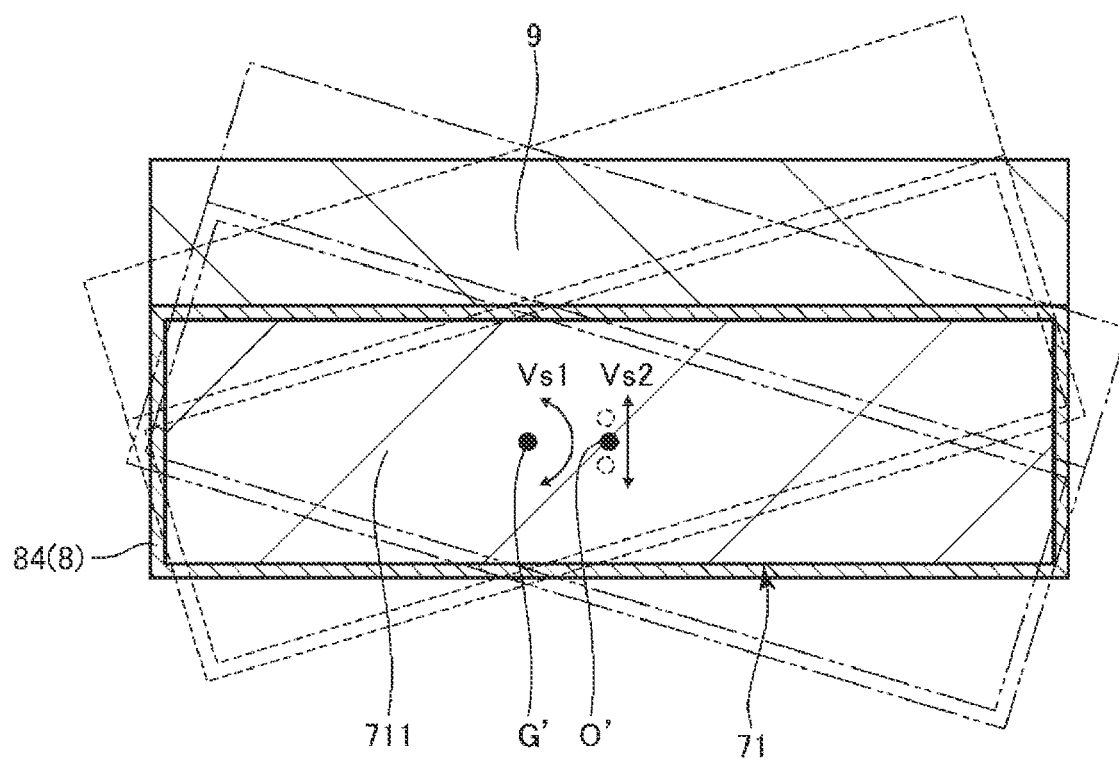
FIG. 12 is a cross-sectional view showing an unwanted vibration of the detection arm.
Figure 13:
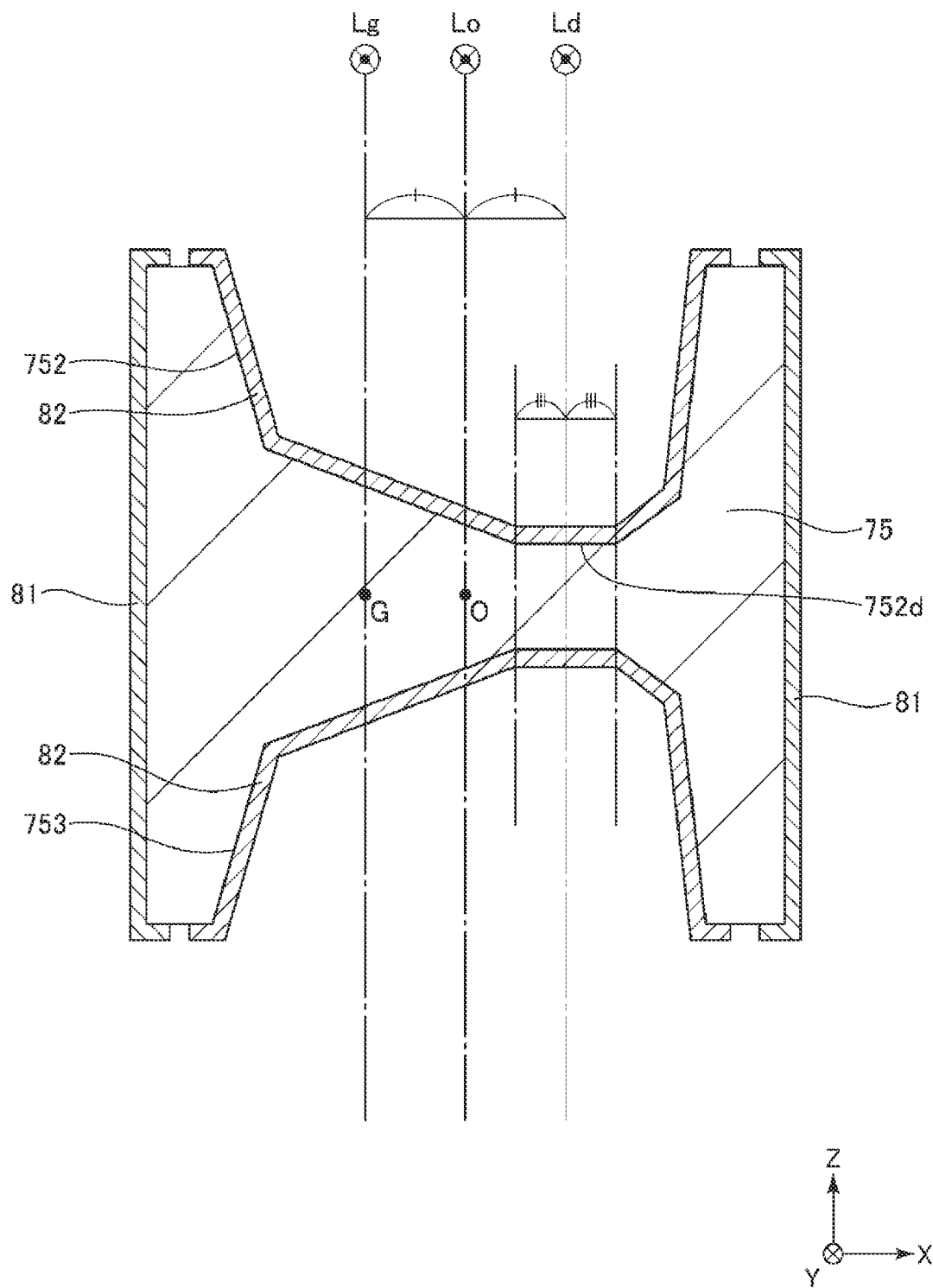
FIG. 13 is a cross-sectional view showing a modified example of the groove in the drive arm.
Figure 14:
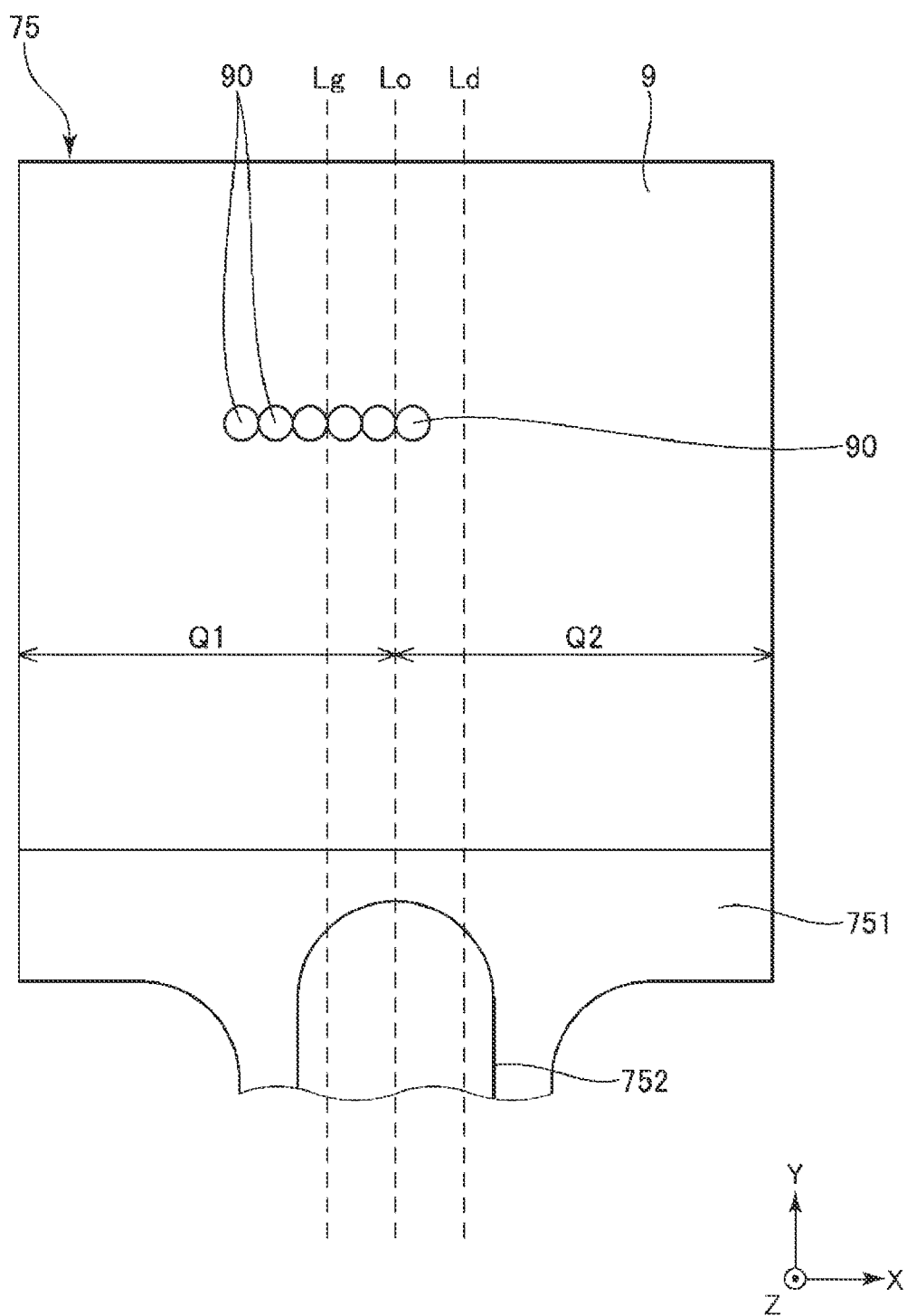
FIG. 14 is a plan view showing processing scars provided to a weight.

FIG. 2 is a plan view of the vibrator device shown in FIG. 1. FIG. 3 is a plan view of a vibrator element provided to the vibrator device shown in FIG. 1. FIG. 4 is a cross-sectional view along the line A-A in FIG. 3. FIG. 5 is a cross-sectional view along the line B-B in FIG. 3. FIG. 6 and FIG. 7 are each a schematic diagram for explaining an action of the vibrator element shown in FIG. 3. FIG. 8 is a cross-sectional view of a drive arm provided to the vibrator element shown in FIG. 3. FIG. 9 is a cross-sectional view of a detection arm provided to the vibrator element shown in FIG. 3. FIG. 10 is a cross-sectional view showing a shape of a groove in the drive arm. FIG. 11 is a cross-sectional view showing an unwanted vibration of the drive arm. FIG. 12 is a cross-sectional view showing an unwanted vibration of the detection arm. FIG. 13 is a cross-sectional view showing a modified example of a groove in the drive arm. FIG. 14 is a plan view showing processing scars provided to a weight. FIG. 15 is a diagram showing a manufacturing process of the vibrator device shown in FIG. 1.

It should be noted that in each of the drawings except FIG. 15 through FIG. 17, there are shown an X axis, a Y axis, and a Z axis as three axes perpendicular to each other for the sake of convenience of explanation. Further, a direction parallel to the X axis is also referred to as an X-axis direction, a direction parallel to the Y axis is also referred to as a Y-axis direction, and a direction parallel to the Z axis is also referred to as a Z-axis direction. Further, the arrow side of each of the axes is also referred to as a positive side, and the opposite side is also referred to as a negative side. Further, the positive side in the Z-axis direction is also referred to as an "upper side," and the negative side thereof is also referred to as a "lower side." Further, a plan view viewed from the Z-axis direction is also referred to simply as a "plan view." Further, as described later, the X axis, the Y axis, and the Z axis correspond to the crystal axes of quartz crystal.

The vibrator device 1 shown in FIG. 1 is a physical quantity sensor for detecting angular velocity ωz defining the Z axis as the detection axis. As described above, by using the vibrator device 1 as the physical quantity sensor, it is possible to install the vibrator device 1 in a wide variety of electronic apparatuses, and thus, the vibrator device 1 which has a high demand, and is high in convenience is achieved. Such a vibrator device 1 has a package 2, a circuit element 3 housed in the package 2, a support substrate 4, and a vibrator element 6.

The package 2 has a base 21 provided with a recessed part 211 opening in an upper surface, and a lid 22 which closes the opening of the recessed part 211 and is bonded to the upper surface of the base 21 via a bonding member 23. The recessed part 211 forms an internal space S inside the package 2, and the circuit element 3, the support substrate 4, and the vibrator element 6 are each housed in the internal space S. For example, the base 21 can be formed of ceramics such as alumina, and the lid 22 can be formed of a metal material such as kovar. It should be noted that the constituent materials of the base 21 and the lid 22 are not particularly limited.

The internal space S is airtightly sealed, and is set in a reduced-pressure state, and more preferably a state approximate to a vacuum state. Thus, the viscosity resistance reduces and the vibration characteristics of the vibrator element 6 are improved. It should be noted that the atmosphere in the internal space S is not particularly limited, but can also be, for example, in the atmospheric pressure state or a pressurized state.

Further, the recessed part 211 is constituted by a plurality of recessed parts, and has a recessed part 211a, a recessed part 211b, and a recessed part 211c wherein the recessed part 211a opens in the upper surface of the base 21, the recessed part 211b opens in a bottom surface of the recessed part 211a and is smaller in opening width than the recessed part 211a, and the recessed part 211c opens in a bottom surface of the recessed part 211b and is smaller in opening width than the recessed part 211b. Further, to the bottom surface of the recessed part 211a, there is fixed the support substrate 4 in a state of supporting the vibrator element 6, and to a bottom surface of the recessed part 211c, there is fixed the circuit element 3.

Further, in the internal space S, the vibrator element 6, the support substrate 4, and the circuit element 3 are disposed so as to overlap each other in a plan view. In other words, the vibrator element 6, the support substrate 4, and the circuit element 3 are arranged side by side along the Z axis. Thus, it is possible to suppress the planar spread towards the X-axis direction and the Y-axis direction of the package 2, and thus, it is possible to achieve reduction in size of the vibrator device 1. Further, the support substrate 4 is located between the vibrator element 6 and the circuit element 3, and supports the vibrator element 6 from the lower side, namely the negative side in the Z axis.

Further, as shown in FIG. 1 and FIG. 2, on the bottom surface of the recessed part 211a, there is disposed a plurality of internal terminals 241, on the bottom surface of the recessed part 211b, there is disposed a plurality of internal terminals 242, and on the lower surface of the base 21, there is disposed a plurality of external terminals 243. The internal terminals 241, 242 and the external terminals 243 described above are electrically coupled via interconnections not shown formed inside the base 21. Further, the internal terminals 241 are electrically coupled to the vibrator element 6 via the support substrate 4, and the internal terminals 242 are electrically coupled to the circuit element 3 via bonding wires BW.

The vibrator element 6 is an angular velocity sensor element capable of detecting the angular velocity defining the Z axis as the detection axis, that is, the angular velocity ωz around the Z axis. As shown in FIG. 3, the vibrator element 6 has a vibrating substrate 7, and electrodes 8 disposed on a surface of the vibrating substrate 7, and weights 9.

The vibrating substrate 7 is formed of a Z-cut quartz crystal substrate. The Z-cut quartz crystal substrate has spread in an X-Y plane defined by the X axis as the electrical axis and the Y axis as the mechanical axis, and has a thickness in a direction along the Z axis as the optical axis, the electrical axis, the mechanical axis, and the optical axis being the crystal axes of quartz crystal. Further, the vibrating substrate 7 has a base part 70, a pair of detection arms 71, 72, a pair of coupling arms 73, 74, a pair of drive arms 75, 76, and a pair of drive arms 77, 78, wherein the base part 70 is located in a central portion, the pair of detection arms 71, 72 extend toward both sides in the Y-axis direction from the base part 70, the pair of coupling arms 73, 74 extend toward both sides in the X-axis direction from the base part 70, the pair of drive arms 75, 76 extend toward the both sides in the Y-axis direction from a tip part of the coupling arm 73, and the pair of drive arms 77, 78 extend toward the both sides in the Y-axis direction from a tip part of the coupling arm 74. In the present embodiment, the detection arms 71, 72, and the drive arms 75, 76, 77, and 78 are each a vibrating arm.

Further, the contour shape of each of the detection arms 71, 72 and the drive arms 75, 76, 77, and 78 is symmetric about the Y axis in a plan view from the Z-axis direction. It should be noted that term "symmetric" described above means that there is included when the right and left shapes include an error which can occur in manufacturing such as a shape shift when performing wet etching due to the crystal axes of quartz crystal besides when the right and left shapes coincide with each other.

Further, the drive arms 75, 76, 77, and 78 have wide portions 751, 761, 771, and 781 larger in width in the X-axis direction than the base end side in tip portions thereof, respectively. Further, the detection arms 71, 72 have wide portions 711, 721 larger in width than the base end side in tip portions thereof, respectively. Thus, it is possible to shorten the detection arms 71, 72 and the drive arms 75, 76, 77, and 78, and thus, reduction in size of the vibrator element 6 can be achieved when being compared at the same frequency. Further, since the length of each of the detection arms 71, 72 and the drive arms 75, 76, 77, and 78 is shortened, the viscosity resistance when these arms vibrate decreases, and thus, the vibration characteristics are improved. It should be noted that the wide portions 711, 721, 751, 761, 771, and 781 are each called a "hammerhead."

Further, as shown in FIG. 4 and FIG. 5, the drive arms 75, 76, 77, and 78 are provided with grooves 752, 762, 772, and 782 each opening in an upper surface as one principal surface, and grooves 753, 763, 773, and 783 each opening in a lower surface as the other principal surface, respectively. Therefore, the drive arms 75, 76, 77, and 78 each have a substantially H-shaped cross-sectional shape. Similarly, the detection arms 71, 72 are respectively provided with grooves 712, 722 each opening in an upper surface as one principal surface, and grooves 713, 723 each opening in a lower surface as the other principal surface. Therefore, the detection arms 71, 72 each have a substantially H-shaped cross-sectional shape. By providing the grooves to the respective arms in such a manner, it is possible to reduce the thermoelastic loss, and thus, the vibration characteristics of the vibrator element 6 are improved.

The electrodes 8 have drive signal electrodes 81, drive constant-potential electrodes 82, first detection signal electrodes 83, first detection ground electrodes 84 as detection constant-potential electrodes, second detection signal electrodes 85, and second detection ground electrodes 86 as the detection constant-potential electrodes.

The drive signal electrodes 81 are disposed on the both side surfaces of each of the drive arms 75, 76, and the upper surface and the lower surface of each of the drive arms 77, 78. Meanwhile, the drive constant-potential electrodes 82 are disposed on the upper surface and the lower surface of each of the drive arms 75, 76, and the both side surfaces of each of the drive arms 77, 78. Further, the first detection signal electrodes 83 are disposed on the upper surface and the lower surface of the detection arm 71, and the first detection ground electrodes 84 are disposed on the both side surfaces of the detection arm 71. Meanwhile, the second detection signal electrodes 85 are disposed on the upper surface and the lower surface of the detection arm 72, and the second detection ground electrodes 86 are disposed on the both side surfaces of the detection arm 72.

These electrodes 81 through 86 are each laid around to a lower surface of the base part 70. Therefore, on the lower surface of the base part 70, there are disposed terminals 701, 702, 703, 704, 705, and 706 wherein the terminal 701 is electrically coupled to the drive signal electrode 81, the terminal 702 is electrically coupled to the drive constant-potential electrode 82, the terminal 703 is electrically coupled to the first detection signal electrode 83, the terminal 704 is electrically coupled to the first detection ground electrode 84, the terminal 705 is electrically coupled to the second detection signal electrode 85, and the terminal 706 is electrically coupled to the second detection ground electrode 86.

Such a vibrator element 6 detects the angular velocity $\omega z$ in the following manner. First, when applying a drive signal between the drive signal electrode 81 and the drive constant-potential electrode 82, the drive arms 75 through 78 flexurally vibrate along an X-Y plane as shown in FIG. 6. Hereinafter, this drive mode is referred to as a drive vibration mode. Further, when the angular velocity $\omega z$ is applied to the vibrator element 6 in the state of performing the drive in the drive vibration mode, a detection vibration mode shown in FIG. 7 is newly excited. In the detection vibration mode, a Coriolis force acts on the drive arms 75 through 78 to excite the vibration in a direction represented by the arrows b, and in concert with this vibration, the detection vibration due to the flexural vibration occurs in a direction represented by the arrows a in the detection arms 71, 72.

Then, a charge generated in the detection arm 71 due to the detection vibration mode is taken out between the first detection signal electrode 83 and the first detection ground electrode 84 as a first detection signal, a charge generated in the detection arm 72 is taken out between the second detection signal electrode 85 and the second detection ground electrode 86 as a second detection signal, and it is possible to detect the angular velocity $\omega z$ based on these first and second detection signals.

Further, as shown in FIG. 3, the weights 9 are disposed on the upper surfaces of the wide portions 751, 761, 771, and 781 of the drive arms 75, 76, 77, and 78, and the upper surfaces of the wide portions 711, 721 of the detection arms 71, 72, respectively. The weights 9 on the wide portions 751, 761, 771, and 781 are for adjusting the frequency and the vibration balance in the drive vibration mode, and the weights 9 on the wide portions 711, 721 are for adjusting the frequency and the vibration balance in the detection vibration mode.

The configuration of the weight 9 is not particularly limited, but the weight 9 can be formed of a metal coating obtained by stacking layers of, for example, Au (gold) or Al (aluminum), or an alloy composed primarily of Au (gold) or Al (aluminum). In the present embodiment, the weights 9 are formed of Au.

Hereinafter, a method of adjusting the frequency and the vibration balance using the weight 9 will briefly be described. As shown in FIG. 8, the weights 9 on the drive arms 75, 76, 77, and 78 are irradiated with a laser beam L to remove a part of each of the weights 9. Thus, it is possible to reduce the mass of each of the drive arms 75, 76, 77, and 78 to raise the frequency in the drive vibration mode. Further, by adjusting an elimination amount and an elimination position of the weight 9 for each of the drive arms 75, 76, 77, and 78, it is also possible to adjust the vibration balance in the drive vibration mode. Similarly, as shown in FIG. 9, the weights 9 on the detection arms 71, 72 are irradiated with the laser beam L to remove a part of each of the weights 9. Thus, it is possible to reduce the mass of each of the detection arms 71, 72 to raise the frequency in the detection vibration mode. Further, by adjusting an elimination amount and an elimination position of the weight 9 for each of the detection arms 71, 72, it is also possible to adjust the vibration balance in the detection vibration mode.

The laser beam L is not particularly limited, but there can be used a pulsed laser beam such as YAG, $YVO_4$, or excimer laser, or a continuous oscillation laser beam such as carbon dioxide laser. It should be noted that in the present embodiment, the pulsed laser beam is used as the laser beam L.

Specifically, by continuously irradiating the weights 9 with the laser beam L converged like a spot, processing of the weights 9 is performed. By using the pulsed laser beam as the laser beam L in such a manner to thereby change the irradiation time or the irradiation pitch while keeping the intensity of the laser beam L without changing the intensity, it is possible to control the irradiation amount, namely an amount of energy, per unit area of the laser beam L to the weights 9. Therefore, the laser beam L is stabilized, and it is possible to accurately perform the present process.

The diameter of a spot SP of the laser beam L is not particularly limited, but is preferably, for example, no larger than 20 μm, and is more preferably no larger than 15 μm. Thus, sufficient microfabrication on the weights 9 becomes possible.

Further, the laser beam L is not particularly limited, but is preferably a picosecond laser beam. It should be noted that the picosecond laser beam is what is obtained by shortening the pulse width of the laser beam L to the picosecond level. By using the picosecond laser, it is possible to evaporate the weights 9 with higher peak power compared to, for example, a typical YAG laser. Therefore, processing low in thermal influence becomes possible. Further, it is possible to effectively prevent reattachment of the weight material having been evaporated to a surface of the weight 9, and thus, it is possible to effectively prevent dross from adhering to the surface of the weight 9.

Further, the pulse width of the laser beam L is not particularly limited, but is preferably shorter than collisional relaxation time as the time for the lattice ion temperature of the constituent material of the weights 9 to be raised to the melting point. Thus, the advantage described above becomes more conspicuous. In the present embodiment, the weights 9 are formed of Au, and the collisional relaxation time of Au is about 25 picoseconds. Therefore, the pulse width of the laser beam L is preferably no more than 25 picoseconds, more preferably no more than 20 picoseconds, and further more preferably no more than 10 picoseconds.

By irradiating the weight 9 with such a laser beam L, a part or the whole of a portion thus irradiated is removed, and thus, processing scars 90 recessed from the surface are formed. It should be noted that as represented by the solid lines in FIG. 8 and FIG. 9, when a part of the portion irradiated with the laser beam L is removed, the weight 9 is made to be a thin film in that part, and thus, the processing scar 90 is formed of the recessed part. Further, as represented by the dotted lines in FIG. 8 and FIG. 9, when the whole of the portion irradiated with the laser beam L is removed, the processing scar 90 is formed of a through hole. The processing scars 90 can each be either one thereof. Further, as described above, since the pulsed laser is used as the laser beam L, the processing scar 90 becomes to have a substantially circular spot-like shape.

The vibrator element 6 has a feature in an arrangement of the processing scars 90. Therefore, hereinafter, the arrangement rule of the processing scars 90, in other words, how the processing scars 90 are arranged at what positions on the weight 9, is specifically described. It should be noted that the detection arms 71, 72, and the drive arms 75, 76, 77, and 78 are substantially the same in the arrangement rule of the processing scars 90. Therefore, hereinafter, the weight 9 on the drive arm 75 will be described as a representative, and the description of the weights 9 on the rest of the detection arms 71, 72 and the drive arms 76, 77, and 78 will be omitted.

As described above, the drive arm 75 is provided with the groove 752 opening in the upper surface thereof, and the groove 753 opening in the lower surface thereof. Further, the grooves 752, 753 are each formed by wet etching. Here, quartz crystal as a base material of the vibrating substrate 7 has etching anisotropy due to the crystal axes. Therefore, as shown in FIG. 10, the cross-sectional shape of each of the grooves 752, 753 fails to become a regular rectangular shape, but becomes an awkward polygon. Further, the grooves 752, 753 become to have a shape asymmetric about an axis passing through the center O of the drive arm 75 along the Z-axis direction.

Therefore, in the cross-sectional view from the Y-axis direction, the centroid G of the drive arm 75 is shifted toward the negative side in the X-axis direction from the center O of the drive arm 75. When such a centroid shift occurs in the drive arm 75, a torsional vibration Vd1 around the Y axis centering on the centroid G and an antiplane vibration Vd2 toward the Z-axis direction of the center O occur in the drive arm 75 as the unwanted vibrations besides the in-plane vibration as a principal vibration in the drive vibration mode as shown in FIG. 11. The same applies to the other drive arms 76, 77, and 78.

Further, when such a centroid shift occurs in the detection arm 71, a torsional vibration Vs1 around the Y axis centering on the centroid G' and an antiplane vibration Vs2 toward the Z-axis direction of the center O' occur in the detection arm 71 as the unwanted vibrations besides the in-plane vibration as a principal vibration in the detection vibration mode as shown in FIG. 12. The same applies to the other detection arm 72.

When the unwanted vibration other than the principal vibration occurs in the detection arms 71, 72 and the drive arms 75, 76, 77, and 78 as described above, the vibration balance of the vibrator element 6 is lost, or a vibration leakage in the vibrator element 6 increases, and thus, the angular velocity detection characteristics of the vibrator element 6 deteriorate.

Therefore, in the present embodiment, the arrangement rule of the processing scars 90 is set so that the shift of the centroid G toward the X-axis direction with respect to the center O decreases to decrease the unwanted vibrations described above compared to before irradiating the weights 9 with the laser beam L. Hereinafter, an axis which overlaps the center O of the drive arm 75 in the plan view from the Z-axis direction, and which extends along the extending direction of the drive arm 75, namely the Y-axis direction, is defined as a central axis Lo, and an axis which overlaps the centroid G of the drive arm 75, and which extends along the extending direction of the drive arm 75 is defined as a centroid axis Lg. It should be noted that it can be said that the center O is the center in the width direction of the upper surface of the drive arm 75, namely the X-axis direction perpendicular to the Y-axis direction as the extending direction, in the plan view from the Z-axis direction.

It should be noted that it is possible to decide the centroid axis Lg based on the centroid G measured using a variety of types of measurement equipment, but it is preferable to uniformly decide the centroid axis Lg in the following manner. In the present embodiment, as shown in FIG. 10, an axis extending along the deepest portion 752d of the groove 752 in the plan view from the Z-axis direction is decided as an imaginary axis Ld, and an axis symmetric to the imaginary axis Ld with respect to the central axis Lo is defined as the centroid axis Lg. Thus, it becomes easy to decide the centroid axis Lg, and it becomes easy to form the processing scars 90. In particular, since it becomes unnecessary to measure the centroid G for each vibrator element 6, it is possible to achieve reduction in manufacturing cycle time of the vibrator element 6.

It should be noted that the deepest portion 752*d* is constituted by surfaces each having a width in some cases as shown in FIG. 13 depending on the width and the depth of the groove 752. In this case, it is possible to decide an axis extending along the center in the width direction of the deepest portion 752*d* in the plan view from the Z-axis direction as the imaginary axis Ld.

As shown in FIG. 14, the processing scars 90 are formed at least in an area at the centroid axis Lg side with respect to the central axis Lo of the weight 9. In other words, the weight 9 has an area Q1 at the negative side in the X-axis direction with respect to the central axis Lo, and an area Q2 at the positive side in the X-axis direction with respect to the central axis Lo, and the processing scars 90 are formed in at least the area Q1. In the present embodiment, the processing scars 90 are formed in each of the areas Q1, Q2. In the configuration shown in FIG. 14, five processing scars 90 are formed in the area Q1, and one processing scar 90 is formed in the area Q2. Further, when the area (a sum of the areas of the five processing scars 90) of the processing scars 90 formed in the area Q1 is defined as S1, and the area of the processing scar 90 formed in the area Q2 is defined as S2, the relationship of S1>S2 is fulfilled. It should be noted that the area described above means the opening area of the processing scar 90 in the plan view from the Z-axis direction.

Thus, in the decrement of the mass of the weight 9 due to the formation of the processing scars 90, the area Q1 becomes larger than the area Q2. In other words, when the decrement of the mass of the weight 9 in the area Q1 is defined as $\Delta Mq1$, and the decrement of the mass of the weight 9 in the area Q2 is defined as $\Delta Mq2$, the relationship of $\Delta Mq1 > \Delta Mq2$ is fulfilled. Therefore, by forming the processing scars 90, the centroid G is shifted toward the center O compared to before forming the processing scars 90, and thus, it is possible to make the centroid G closer to the center O, or preferably make the centroid G coincide with the center O. As a result, by forming the processing scars 90, the unwanted vibration of the drive arm 75 described above decreases, and it is possible to effectively prevent the deterioration of the vibration characteristics of the vibrator element 6.

Here, the processing scars 90 are formed by being irradiated with the laser beam L in the same condition. Therefore, the processing scars 90 are the same in opening area and depth as each other, and are the same in volume as each other. It should be noted that the term "same" described above means that there is included when there is an error which can occur in the manufacturing process besides when the shapes are the same as each other. Thus, it is possible to fulfill the relationship of $\Delta Mq1 > \Delta Mq2$ as long as the relationship of (the number of the processing scars 90 formed in the area Q1)>(the number of the processing scars 90 formed in the area Q2) is fulfilled. Therefore, it is possible to more easily decide the arrangement of the processing scars 90.

It should be noted that it is possible for the shape of at least one of the processing scars 90 to be different from the shapes of the rest of the processing scars 90. In this case, by fulfilling the relationship of (the volume of the processing scars 90 formed in the area Q1)>(the volume of the processing scars 90 formed in the area Q2), it is possible to fulfill the relationship of $\Delta Mq1 > \Delta Mq2$.

Further, in the plan view from the Z-axis direction, the processing scars 90 are formed at both sides in the X-axis direction with respect to the centroid axis Lg. In the configuration shown in FIG. 14, three processing scars 90 are formed at the negative side in the X-axis direction of the centroid axis Lg, and three processing scars 90 are formed at the positive side in the X-axis direction of the centroid axis Lg. Further, a sum of the areas of the three processing scars 90 formed at the negative side in the X-axis direction of the centroid axis Lg and a sum of the areas of the three processing scars 90 formed at the positive side in the X-axis direction of the centroid axis Lg are equal to each other. Thus, the processing scars 90 are disposed at the both sides of the centroid axis Lg in a balanced manner, and thus, it is possible to more surely make the centroid G closer to the center O. Further, the arrangement of the processing scars 90 becomes easier. It should be noted that the term "equal" described above means there is included when the areas are slightly different from each other due to, for example, an error which can occur in the manufacturing process besides when the areas coincide with each other.

Further, in the plan view from the Z-axis direction, the six processing scars 90 are arranged side by side in the X-axis direction so as to be symmetric about the centroid axis Lg. Thus, the processing scars 90 are disposed at the both sides of the centroid axis Lg in a more balanced manner, and thus, it is possible to more surely make the centroid G closer to the center O. Further, the arrangement of the processing scars 90 becomes easier.

The arrangement rule of the processing scars 90 is hereinabove described. The number and the arrangement of the processing scars 90 are not particularly limited as long as the relationship of S1>S2 is fulfilled. For example, it is not required to form the processing scar 90 in the area Q2. Further, the area of the processing scars 90 formed at the negative side in the X-axis direction of the centroid axis Lg and the area of the processing scars 90 formed at the positive side in the X-axis direction of the centroid axis Lg can be different from each other. Further, the processing scars 90 formed at the negative side in the X-axis direction of the centroid axis Lg and the processing scars 90 formed at the positive side in the X-axis direction of the centroid axis Lg can be asymmetric about the centroid axis Lg. Further, for example, it is preferable to fulfill the relationship of S1>S2 in all of the detection arms 71, 72 and the drive arms 75, 76, 77, and 78, but this is not a limitation, and it is sufficient to fulfill the relationship of S1>S2 in at least one of the detection arms 71, 72 and the drive arms 75, 76, 77, and 78.

It should be noted that the six processing scars 90 are the same in formation position in the Y-axis direction as each other as shown in FIG. 14, but this is not a limitation, and it is possible for at least one of the processing scars 90 to be formed so as to be shifted in the Y-axis direction with respect to the rest of the processing scars 90.

Going back to FIG. 1, the circuit element 3 is fixed to the bottom surface of the recessed part 211*c*. The circuit element 3 includes a drive circuit and a detection circuit for driving the vibrator element 6 to detect the angular velocity ωz applied to the vibrator element 6. It should be noted that the circuit element 3 is not particularly limited, and can include another circuit such as a temperature compensation circuit.

Further, the support substrate 4 is a substrate used for TAB (Tape Automated Bonding) mounting. As shown in FIG. 2, the support substrate 4 has a base body 41 shaped like a frame and a plurality of leads 42 as interconnections provided to the base body 41.

The base body 41 is formed of a film formed of insulating resin such as polyimide. It should be noted that the constituent material of the base body 41 is not particularly limited, and the base body 41 can be formed of, for example, insulating resin other than polyimide. Further, the base body 41 is fixed to the bottom surface of the recessed part 211a with bonding members B1, and further, the leads 42 and the internal terminals 241 are electrically coupled to each other via the bonding members B1. Further, the base part 70 of the vibrator element 6 is fixed to tip portions of the leads 42 with bonding members B2, and further, the leads 42 and the terminals 701 through 706 are electrically coupled to each other via the bonding members B2, respectively. Thus, the vibrator element 6 is supported by the base 21 via the support substrate 4, and at the same time, electrically coupled to the circuit element 3.

The base body 41 has a frame-like shape in the plan view from the Z-axis direction, and has an opening part 411 inside. The six leads 42 are bonding leads for supporting the vibrator element 6, and are wiring patterns constituted by electrically conductive members having electrical conductivity. In the present embodiment, as the electrically conductive members, there is used a metal material such as copper (Cu) or a copper alloy. The six leads 42 are each fixed to a lower surface of the base body 41.

Further, three leads 42 out of the six leads 42 are disposed in a part at the positive side in the X-axis direction with respect to the center of the base body 41, and the tip portions thereof extend to the inside of the opening part 411 of the base body 41. Meanwhile, three leads 42 as the rest of the leads 42 are disposed in a part at the negative side in the X-axis direction with respect to the center of the base body 41, and the tip portions thereof extend to the inside of the opening part 411 of the base body 41. A base end portion of each of the leads 42 is disposed on a lower surface of the base body 41, and is electrically coupled to corresponding one of the internal terminals 241 via the bonding member B1.

Further, the leads 42 each bend in the middle to be tilted upward, and thus, the tip portions thereof are located above, namely at the positive side in the Z-axis direction of, the base body 41. Further, the base part 70 of the vibrator element 6 is fixed to the tip portions of the leads 42 via the bonding members B2. Further, the leads 42 are electrically coupled to the corresponding terminals 701 through 706 via the bonding members B2, respectively.

It should be noted that the bonding members B1, B2 are not particularly limited as long as both of the electrical conductivity and the bonding property are provided, and it is possible to use, for example, a variety of metal bumps such as gold bumps, silver bumps, copper bumps, or solder bumps, or an electrically conductive adhesive having an electrically conductive filler such as a silver filler dispersed in a variety of adhesives such as a polyimide type adhesive, an epoxy type adhesive, a silicone type adhesive, or an acrylic adhesive. When using the metal bumps which are in the former group as the bonding members B1, B2, it is possible to suppress generation of a gas from the bonding members B1, B2, and it is possible to effectively prevent a change in environment, in particular rise in pressure, of the internal space S. On the other hand, when using the electrically conductive adhesive which is in the latter group as the bonding members B1, B2, the bonding members B1, B2 become relatively soft, and it is possible to absorb or relax the stress in the bonding members B1, B2.

The configuration of the vibrator device 1 is hereinabove described. Then, a method of manufacturing the vibrator device 1, in particular, a method of manufacturing the vibrator element 6 included therein, will be described. As shown in FIG. 15, the method of manufacturing the vibrator device 1 includes a preparation process of preparing the vibrator element 6 in a quartz crystal wafer, a first frequency adjustment process of adjusting the frequency of the vibrator element 6 on the quartz crystal wafer, a mounting process of mounting the vibrator element 6 on the base 21, a second frequency adjustment process of adjusting the frequency of the vibrator element 6 on the base 21, and a sealing process of bonding the lid 22 to the base 21.

Preparation Process

First, by preparing the quartz crystal wafer and patterning the quartz crystal wafer using a photolithography technique and an etching technique, a plurality of vibrating substrates 7 is formed in the quartz crystal wafer. Then, the electrodes 8 are formed on the surfaces of the vibrating substrates 7 using sputtering or the like, and further, the weights 9 are formed on the upper surfaces of the wide portions 711, 721, 751, 761, 771, and 781 of the detection arms 71, 72 and the drive arms 75, 76, 77, and 78 using evaporation or the like. Thus, the vibrator elements 6 can be obtained.

First Frequency Adjustment Process

Then, the resonance frequency and the vibration balance of the vibrator element 6 are adjusted on the quartz crystal wafer. Specifically, the four weights 9 disposed on the drive arms 75, 76, 77, and 78 are irradiated with the laser beam L to form the processing scars 90 based on such an arrangement rule as described above. Thus, it is possible to adjust the frequency and the vibration balance in the drive vibration mode, and at the same time, it is possible to effectively reduce the unwanted vibrations of the drive arms 75, 76, 77, and 78 in the drive vibration mode. Similarly, the two weights 9 disposed on the detection arms 71, 72 are irradiated with the laser beam L to form the processing scars 90 based on such an arrangement rule as described above. Thus, it is possible to adjust the frequency and the vibration balance in the detection vibration mode, and at the same time, it is possible to effectively reduce the unwanted vibrations of the detection arms 71, 72 in the detection vibration mode.

It should be noted that there is no need to provide the processing scars 90 to all of the weights 9, and when there is a weight 9 which is not required to be provided with the processing scars 90, it is possible to omit to form the processing scars 90 on that weight 9. Further, when there is a plurality of weights 9 which is required to be provided with the processing scars 90, it is preferable to form the processing scars 90 based on the arrangement rule described above with respect to all of the weights 9, but this is not a limitation, and it is sufficient to form the processing scars 90 based on the arrangement rule described above with respect to at least one weight 9.

Mounting Process

Then, the vibrator element 6 is broken off from the quartz crystal wafer, and then the vibrator element 6 thus broken off is bonded to the base 21 via the support substrate 4. It should be noted that the circuit element 3 is mounted on the base 21 in advance.

Second Frequency Adjustment Process

There is a possibility that the resonance frequency and the vibration balance of the vibrator element 6 vary from the resonance frequency and the vibration balance on the quartz crystal wafer by fixing the vibrator element 6 to the base 21 in the mounting process described above. Therefore, in the present process, the processing scars 90 are formed to at least one weight 9 to adjust the resonance frequency and the vibration balance in the drive vibration mode and the resonance frequency and the vibration balance in the detection vibration mode in substantially the same manner as in the first frequency adjustment process described above. It should be noted that the present process can be omitted when not required.

Sealing Process

Then, in the vacuum state, for example, the lid 22 is seam welded to an upper surface of the base 21 via the bonding member 23 made of a seam ring. Thus, the internal space S is airtightly sealed, and the vibrator device 1 is obtained.

The method of manufacturing the vibrator device 1 is described hereinabove, but the method of manufacturing the vibrator device 1 is not particularly limited providing the method follows the arrangement rule of the processing scars. For example, when performing the second frequency adjustment process, the first frequency adjustment process can be omitted. Further, when performing the first frequency adjustment process, the second frequency adjustment process can be omitted. Further, either one of the first frequency adjustment process and the second frequency adjustment process can be performed using a different frequency adjustment method from the method described above.

The vibrator device 1 and the method of manufacturing the vibrator device 1 are hereinabove described. The vibrator element 6 included in such a vibrator device 1 has the base part 70, the detection arms 71, 72 and the drive arms 75, 76, 77, and 78 as the vibrating arms coupled to the base part 70, and the weights 9 disposed on the upper surfaces as the principal surfaces of the detection arms 71, 72 and the drive arms 75, 76, 77, and 78. Further, the weights 9 are provided with the processing scars 90 which are partially removed and are recessed in the thickness direction of the detection arms 71, 72 and the drive arms 75, 76, 77, and 78, namely the Z-axis direction, respectively. When the axis which overlaps the center O in the width direction of the drive arm 75, and which extends along the Y-axis direction as the extending direction of the drive arm 75 is defined as the central axis Lo, and the axis which overlaps the centroid G of the drive arm 75, and which extends along the Y-axis direction as the extending direction of the drive arm 75 is defined as the centroid axis Lg in the plan view of the upper surface, the processing scars 90 are formed in at least the area Q1 located at the centroid axis Lg side with respect to the central axis Lo. Further, when the area of the processing scars 90 located at the centroid axis Lg side of the central axis Lo is defined as S1 and the area of the processing scars 90 located at the opposite side to the centroid axis Lg of the central axis Lo is defined as S2, the relationship of S1>S2 is fulfilled. It should be noted that this relationship similarly applies to the detection arms 71, 72 and the drive arms 76, 77, and 78.

Thus, in the decrement of the mass of the weight 9 due to the formation of the processing scars 90, the area Q1 becomes larger than the area Q2. In other words, when the decrement of the mass of the weight 9 in the area Q1 is defined as ΔMq1, and the decrement of the mass of the weight 9 in the area Q2 is defined as ΔMq2, the relationship of ΔMq1>ΔMq2 is fulfilled. Therefore, by forming the processing scars 90, the centroid G is shifted toward the center O compared to before forming the processing scars 90, and thus, it is possible to make the centroid G closer to the center O, or preferably make the centroid G coincide with the center O. As a result, by forming the processing scars 90, the unwanted vibration decreases, and it is possible to effectively prevent the deterioration of the vibration characteristics of the vibrator element 6.

Further, as described above, the processing scars 90 are formed at both sides in the X-axis direction as the width direction with respect to the centroid axis Lg. Further, the area of the processing scars 90 formed at one side in the X-axis direction with respect to the centroid axis Lg and the area of the processing scars 90 formed at the other side in the X-axis direction with respect to the centroid axis Lg are equal to each other. Thus, the processing scars 90 are disposed at the both sides of the centroid axis Lg in a balanced manner, and thus, it is possible to more surely make the centroid G closer to the center O. Further, the arrangement of the processing scars 90 becomes easier.

Further, as described above, the processing scars 90 are disposed symmetrically about the centroid axis Lg. Thus, the processing scars 90 are disposed at the both sides of the centroid axis Lg in a more balanced manner, and thus, it is possible to more surely make the centroid G closer to the center O. Further, the arrangement of the processing scars 90 becomes easier.

Further, as described above, the processing scars 90 are each shaped like a spot. Thus, it becomes easy to process the weights 9.

Further, as described above, the vibrator element 6 has the pair of detection arms 71, 72 extending toward the both sides in the Y-axis direction as a first direction from the base part 70, the pair of coupling arms 73, 74 extending toward the both sides in the X-axis direction as a second direction perpendicular to the Y-axis direction from the base part 70, the pair of drive arms 75, 76 as the vibrating arms extending toward the both sides in the Y-axis direction from one coupling arm 73, and the pair of drive arms 77, 78 as the vibrating arms extending toward the both sides in the Y-axis direction from the other coupling arm 74. Thus, it is possible to effectively adjust the frequency and the vibration balance in the drive vibration mode of the vibrator element 6.

Further, as described above, the vibrator element 6 has the pair of detection arms 71, 72 as the vibrating arms extending toward the both sides in the Y-axis direction as the first direction from the base part 70, the pair of coupling arms 73, 74 extending toward the both sides in the X-axis direction as the second direction perpendicular to the Y-axis direction from the base part 70, the pair of drive arms 75, 76 extending toward the both sides in the Y-axis direction from one coupling arm 73, and the pair of drive arms 77, 78 extending toward the both sides in the Y-axis direction from the other coupling arm 74. Thus, it is possible to effectively adjust the frequency and the vibration balance in the detection vibration mode of the vibrator element 6.

Further, as described above, the vibrator device 1 has the vibrator element 6. Thus, it is possible for the vibrator device 1 to acquire the advantages of the vibrator element 6, and exert the high reliability.

Further, as described above, the method of manufacturing the vibrator element 6 includes the step of preparing the vibrator element 6 having the base part 70, the detection arms 71, 72 and the drive arms 75, 76, 77, and 78 as the vibrating arms coupled to the base part 70, and the weights 9 disposed on the upper surfaces as the principal surfaces of the detection arms 71, 72 and the drive arms 75, 76, 77, and 78, the step of forming the processing scars 90 on the weights 9 by irradiating the weights 9 with the laser beam L to thin or remove the weights 9 in the thickness direction of the detection arms 71, 72 and the drive arms 75, 76, 77, and 78. Further, when the axis which overlaps the center O in the width direction of the drive arm 75, and which extends along the Y-axis direction as the extending direction of the drive arm 75 is defined as the central axis Lo, and the axis which overlaps the centroid G of the drive arm 75, and which extends along the Y-axis direction as the extending direction of the drive arm 75 is defined as the centroid axis Lg in the plan view of the upper surface, the processing scars 90 are formed in at least the area Q1 located at the centroid axis Lg side with respect to the central axis Lo in the step of forming the processing scars 90. Further, when the area of the processing scars 90 located at the centroid axis Lg side of the central axis Lo is defined as S1 and the area of the processing scars 90 located at the opposite side to the centroid axis Lg of the central axis Lo is defined as S2, the relationship of S1>S2 is fulfilled.

Thus, in the decrement of the mass of the weight 9 due to the formation of the processing scars 90, the area Q1 becomes larger than the area Q2. In other words, when the decrement of the mass of the weight 9 in the area Q1 is defined as ΔMq1, and the decrement of the mass of the weight 9 in the area Q2 is defined as ΔMq2, the relationship of ΔMq1>ΔMq2 is fulfilled. Therefore, by forming the processing scars 90, the centroid G is shifted toward the center O compared to before forming the processing scars 90, and thus, it is possible to make the centroid G closer to the center O, or preferably make the centroid G coincide with the center O. As a result, by forming the processing scars 90, the unwanted vibration decreases, and it is possible to effectively prevent the deterioration of the vibration characteristics of the vibrator element 6.

Although the vibrator element, the vibrator device, and the method of manufacturing the vibrator element according to the present disclosure are hereinabove described based on the illustrated embodiment, the present disclosure is not limited thereto, but the configuration of each of the constituents can be replaced with one having an arbitrary configuration with an equivalent function. Further, the present disclosure can also be added with any other constituents. Further, it is also possible to arbitrarily combine any of the embodiments with each other.

What is claimed is:

1. A vibrator element comprising:
   a base part;
   a vibrating arm coupled to the base part; and
   a weight provided to a principal surface of the vibrating arm, wherein
   the weight is provided with at least one processing scar which is partially removed, and which is recessed in a thickness direction of the vibrating arm,
   when an axis which overlaps a center in a width direction of the vibrating arm, and which extends along an extending direction of the vibrating arm is defined as a central axis, and an axis which overlaps a centroid of the vibrating arm, and which extends along the extending direction of the vibrating arm is defined as a centroid axis in a plan view of the principal surface, the at least one processing scar is formed in at least an area at the centroid axis side with respect to the central axis, and
   an area of the at least one processing scar located at the centroid axis side with respect to the central axis is greater than an area of the at least one processing scar located at an opposite side to the centroid axis with respect to the central axis.

2. The vibrator element according to claim 1, wherein
   the at least one processing scar includes processing scars, wherein the processing scars are formed at both sides in the width direction with respect to the centroid axis, and
   an area of the processing scars formed at one side in the width direction with respect to the centroid axis and an area of the processing scars formed at another side in the width direction with respect to the centroid axis are equal to each other.

3. The vibrator element according to claim 2, wherein the processing scars are disposed symmetrically about the centroid axis.

4. The vibrator element according to claim 1, wherein the at least one processing scar is shaped like a spot.

5. The vibrator element according to claim 1, wherein the vibrator element comprises vibrating arms, the vibrating arms being a plurality of the vibrating arm, and the vibrator element further comprises:
   a pair of detection arms extending toward both sides in a first direction from the base part;
   a pair of coupling arms extending toward both sides in a second direction perpendicular to the first direction from the base part;
   a pair of drive arms as the vibrating arms extending toward the both sides in the first direction from one of the coupling arms; and
   a pair of drive arms as the vibrating arms extending toward the both sides in the first direction from the other of the coupling arms.

6. The vibrator element according to claim 1, wherein the vibrator element comprises vibrating arms, the vibrating arms being a plurality of the vibrating arm, and the vibrator element further comprises:
   a pair of detection arms as the vibrating arms extending toward the both sides in the first direction from the base part;
   a pair of coupling arms extending toward both sides in a second direction perpendicular to the first direction from the base part;
   a pair of drive arms extending toward the both sides in the first direction from one of the coupling arms; and
   a pair of drive arms extending toward the both sides in the first direction from the other of the coupling arms.

7. A vibrator device comprising:
   the vibrator element according to claim 1.

8. A method of manufacturing a vibrator element, comprising:
   preparing a vibrator element including a base part, a vibrating arm coupled to the base part, and a weight provided to a principal surface of the vibrating arm; and
   forming at least one processing scar on the weight by irradiating the weight with a laser beam to thin or remove the weight in a thickness direction of the vibrating arm, wherein
   when an axis which overlaps a center in a width direction of the vibrating arm, and which extends along an extending direction of the vibrating arm is defined as a central axis, and an axis which overlaps a centroid of the vibrating arm, and which extends along the extending direction of the vibrating arm is defined as a centroid axis in a plan view of the principal surface, the at least one processing scar is formed in at least an area at the centroid axis side with respect to the central axis in the forming at least one processing scar, and
   an area of the at least one processing scar located at the centroid axis side with respect to the central axis is greater than an area of the at least one processing scar located at an opposite side to the centroid axis with respect to the central axis.

9. The method according to claim 8, wherein
in the forming at least one processing scar, processing scars are formed at both sides in the width direction with respect to the centroid axis, and
an area of the processing scars formed at one side in the width direction with respect to the centroid axis and an area of the processing scars formed at another side in the width direction with respect to the centroid axis are equal to each other.

10. The method according to claim 9, wherein
in the forming at least one processing scar, the processing scars are disposed symmetrically about the centroid axis.

11. The method according to claim 8, wherein
in the forming at least one processing scar, the at least one processing scar is shaped like a spot.

* * * * *